(12) United States Patent
Pan et al.

(10) Patent No.: US 8,253,175 B2
(45) Date of Patent: Aug. 28, 2012

(54) SEALED SEMICONDUCTOR DEVICE

(76) Inventors: Zhong Pan, San Jose, CA (US); Craig Ciesla, Mountin View, CA (US)

( * ) Notice: Subject to any disclaimer, the term of this patent is extended or adjusted under 35 U.S.C. 154(b) by 258 days.

(21) Appl. No.: 12/689,112

(22) Filed: Jan. 18, 2010

(65) Prior Publication Data

US 2010/0181651 A1    Jul. 22, 2010

Related U.S. Application Data

(60) Provisional application No. 61/145,694, filed on Jan. 19, 2009.

(51) Int. Cl.
*H01L 23/28* (2006.01)
(52) U.S. Cl. .................. 257/222; 257/E21.407; 438/522
(58) Field of Classification Search .................. 257/222, 257/223, 258, E21.407, E29.091; 438/522
See application file for complete search history.

(56) References Cited

U.S. PATENT DOCUMENTS

| | | | |
|---|---|---|---|
| 5,288,989 A | 2/1994 | Ishaque et al. | 250/214.1 |
| 6,774,448 B1 | 8/2004 | Lindemann et al. | 257/443 |
| 7,439,599 B2 | 10/2008 | Gao et al. | 257/443 |
| 7,569,409 B2 | 8/2009 | Lin et al. | 438/33 |
| 2002/0057406 A1* | 5/2002 | Yasukawa | 349/113 |
| 2003/0205721 A1* | 11/2003 | Nishii et al. | 257/194 |
| 2005/0269702 A1* | 12/2005 | Otsuka | 257/750 |
| 2006/0076589 A1 | 4/2006 | Gao et al. | 357/292 |
| 2008/0283975 A1 | 11/2008 | Matz et al. | 257/642 |

* cited by examiner

*Primary Examiner* — Thomas L Dickey
(74) *Attorney, Agent, or Firm* — Matthew A. Pequignot; Pequignot + Myers LLC (57) ABSTRACT

A sealed semiconductor device having reduced delamination of the sealing layer in high temperature, high humidity conditions is disclosed. The semiconductor device includes a substrate and a stack of device layers on the substrate sealed with a sealing layer. The upper surface of a street area of the substrate is oxidized so that the oxidized region extends under the sealing layer. The presence of the oxidized region of the upper surface of the substrate helps reduce the delamination, because the oxidized surface does not react with water to the same extent as a non-oxidized surface. The semiconductor devices remain sealed after dicing through the street area because the oxidized surface does not delaminate.

20 Claims, 7 Drawing Sheets

SEALED SEMICONDUCTOR DEVICE

CROSS-REFERENCE TO RELATED APPLICATIONS

The present invention claims priority from U.S. patent application Ser. No. 61/145,694 filed Jan. 19, 2009, which is incorporated herein by reference for all purposes.

TECHNICAL FIELD

The present invention relates to semiconductor devices, and in particular to semiconductor devices having reduced delamination of layers, and to methods of reducing such delamination.

BACKGROUND OF THE INVENTION

In optical communications, light is modulated at a transmitter end of an optical fiber, transmitted to a receiver end of the optical fiber, and detected at the receiver end, where it is demodulated to retrieve the information being communicated. Typically, semiconductor laser diodes are used to generate the information-carrying light, and semiconductor photodiodes are used to detect the transmitted light at the receiver end.

Reliability and environmental requirements for telecommunications equipment, including optical communications equipment, are known to be quite stringent. It is common for telecommunication equipment components, even for those usable in a "central office" environment, to be constructed to withstand, without failure, hundreds and even thousands of hours of operation at extremely challenging environmental conditions, such as 85° C. at 85% of relative humidity. These stringent environmental requirements are usually met by using a hermetically sealed package enclosing the components.

Although reliable, hermetic packages are costly to produce and to seal. The cost of hermetic packages can be comparable to the cost of the semiconductor devices, such as lasers or photodiodes, sealed within the packages. In modern business environment, a motivation exists to reduce costs of telecommunications equipment. The cost reduction could in principle be achieved by providing semiconductor devices that are tolerant to high temperature, high humidity environment, so that no hermetic packages are required to protect them.

Unfortunately, it is rather difficult to make semiconductor devices humidity tolerant. Semiconductor devices contain thin film layer stacks. Water molecules are known to attack the integrity of the stacks at elevated temperatures, causing layer delamination and a device failure.

Figure 1:
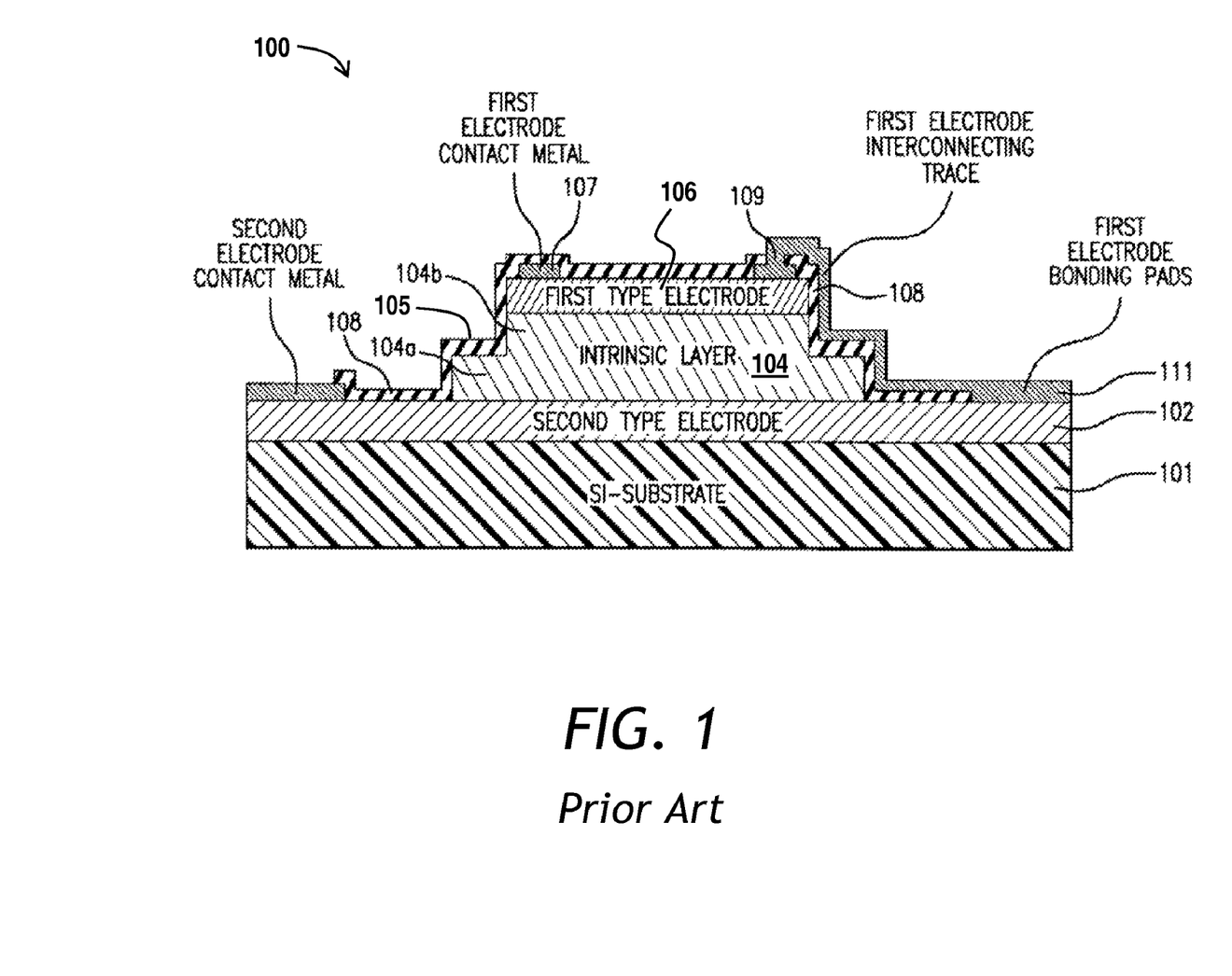
FIG. 1 is a lateral cross-sectional view of a prior-art PIN diode having a sealing dielectric layer.

In US Patent Application Publication 2006/0076589 A1 incorporated herein by reference, Gao et al. disclose a PIN photodiode and a method of manufacturing a PIN photodiode that has reduced delamination of dielectric layers. Referring to FIG. 1, a PIN photodiode 100 of Gao et al. has a semi-insulating (SI) substrate 101, a second type electrode 102 disposed on the substrate 101, an intrinsic layer 104 disposed on the second type electrode 102, having a horizontal step 105 between portions 104a and 104b, a first type electrode 106 disposed on the intrinsic layer 104, and a first electrode contact metal 107. A first electrode bonding pad 111 is coupled to the first type electrode 106 through a via 109. The stack of layers 102 to 106 is covered with a dielectric layer 108 sealing the structure 102/104/106. The horizontal step 105 in the intrinsic layer 104 of the PIN structure is for improving adhesion of the dielectric layer 108 and for confining the extent of delamination of the dielectric layer 108. Detrimentally, the delamination of the sealing dielectric layer 108, although localized due to the presence of horizontal step 105, may still be present in the device 100 of FIG. 1.

In US Patent Application Publication 2008/0283975 A1 incorporated herein by reference, Matz et al. teach that a thin silicon oxide layer improves adhesion between an etch stop layer and an ultra-low k dielectric layer of a semiconductor device. Detrimentally, the improved adhesion of the etch stop layer does not reduce or prevent delamination of a sealing layer in a high humidity environment.

The prior art lacks a semiconductor device and a method for manufacturing a semiconductor device, in which delamination of the entire sealing layer in a high temperature, high humidity environment were reduced. Accordingly, it is a goal of the present invention to provide a device having reduced delamination of layers, and a method of manufacturing such a device.

SUMMARY OF THE INVENTION

In accordance with the invention there is provided a sealed semiconductor device comprising:
  a substrate having a top surface including adjacently disposed structure and street areas;
  a semiconductor layer structure disposed on the structure area;
  a sealing layer disposed on the semiconductor layer structure, for sealing the semiconductor layer structure;
  wherein the street area includes an oxidized region of the substrate in contact with the sealing layer, for lessening delamination of the sealing layer from the substrate.

In one embodiment of the invention, the substrate is a semi-insulating (SI) substrate. Further, the sealing layer preferably overlaps the oxidized region. Further, preferably, the oxidized region is at least 0.2 microns thick and contains at least 90% oxide.

In accordance with another aspect of the invention there is provided a method of manufacturing the semiconductor device, comprising:
  (a) providing the semiconductor layer structure disposed on the structure area of the top surface of the substrate;
  (b) depositing the sealing layer on top of the semiconductor layer structure;
  (c) patterning the sealing layer to expose the street area of the top surface of the substrate; and
  (d) oxidizing the street area, so as to obtain the oxidized region in contact with the patterned sealing layer.

In accordance with yet another aspect of the invention there is further provided a method for lessening delamination of a sealing layer for sealing a semiconductor layer structure disposed on a substrate, the method comprising:
  (a) coating the semiconductor layer structure with a sealing layer;
  (b) patterning the sealing layer to open a street area on the top surface of the substrate; and
  (c) oxidizing the street area opened in step (b), so as to form an oxidized region of the street area, so that the sealing layer is in contact with the oxidized region.

In one embodiment of the invention, the oxidizing of the street area is performed by anodization. Preferably, the duration of anodizing and/or the anodizing current are selected so as to cause the oxidized region to extend beneath the sealing layer.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 2:
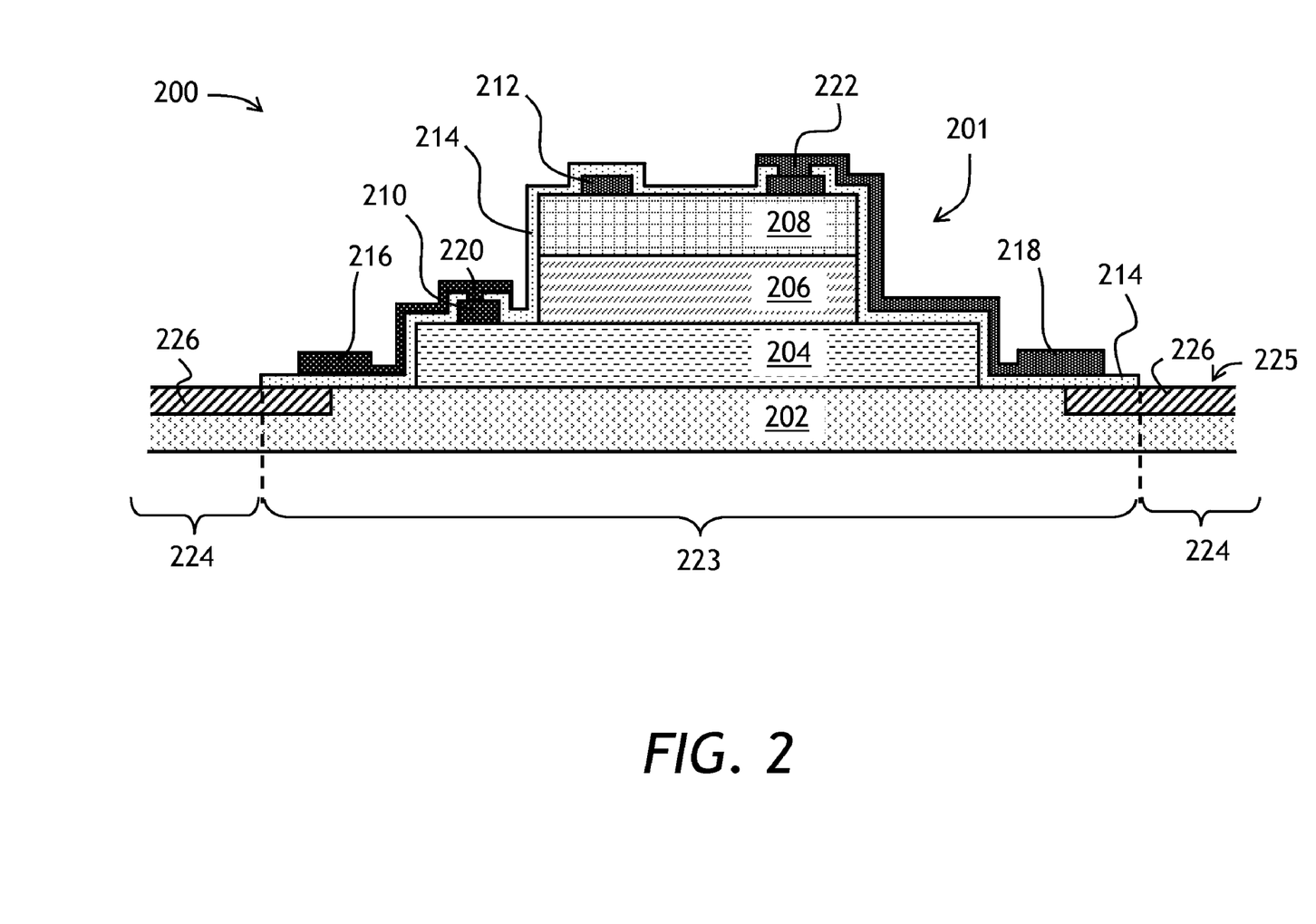
FIG. 2 is a lateral cross-sectional view of a semiconductor device of the present invention having a sealing layer in contact with an oxidized surface of the substrate.

Referring to FIG. 2, a lateral cross-sectional view of a sealed PIN photodiode 200 of the present invention is shown. The photodiode 200 has a mesa type PIN structure 201 disposed on a structure area 223 of a top surface 225 of a substrate 202. The PIN structure 201 has a stack of a P-layer, I-layer, and N-layer 208, 206, and 204, respectively. A N-contact metal ring 210 is disposed upon and is in an electrical contact with the N-layer 204. A P-contact metal ring 212 is disposed upon and is on an electrical contact with the P-layer 208. A sealing layer 214 is disposed over the PIN structure 201, for passivating and sealing the PIN structure 201. N- and P-bonding pads 216 and 218 are disposed over the sealing layer 214, forming contact with the N- and P-contact metal rings 210 and 212, respectively, through vias 220 and 222, respectively, in the sealing layer 214. The P- and N-contact metal rings 210 and 212, respectively, are shown in a cross-section. The N-contact metal ring 210 is an open ring having a shape of letter "C".

The sealing layer 214 extends up to a "street" area 224 of the top surface 225 of the SI substrate 202. The street area is used for subsequent wafer dicing into individual devices 200. The street area 224 includes an oxidized region 226 of the substrate 202 in contact with the sealing layer 214. As seen in FIG. 2, the sealing layer 214 overlaps the oxidized region 226. For simplicity, although the street area 224 is shown in FIG. 2 as an area not having the sealing layer 214, it is to be understood that the oxidized region 226 of the substrate 202 extends under the sealing layer 214. Preferably, the oxidized region 226 has an uninterrupted crystalline structure of the bulk of the substrate 202. Further, preferably, the oxidized region is at least 0.2 microns thick and contains at least 90% oxide.

Advantageously, the oxidized region 226 facilitates reduction of delamination of the sealing layer 214 from the substrate 202 in high temperature, high humidity conditions. Water molecules do not react as strongly with the oxidized surface of the substrate 202 as they do with a bare surface of the substrate 202, which reduces delamination. Further, advantageously, due to the uninterrupted crystalline structure of the oxidized region 226, the oxidized region 226 does not delaminate upon dicing or scribing in the street area 224 to separate individual devices 200 from each other. This ensures a high yield of the dicing or scribing procedure, resulting in substantially no cracks or delamination of the sealing layer 214. When the integrity of the sealing layer is preserved upon dicing or scribing, the overall reliability and stability of the individual devices 200 is high.

As one skilled in the art will understand, the material composition of the various layers of the PIN diode 200 may vary, depending upon a particular material system selected. By way of a non-limiting example, the substrate 202 is a SI (Semi-insulating) indium phosphide (InP) substrate, the N-layer 204 is a InP layer, the I-layer 206 is an indium gallium arsenide (InGaAs) layer, the P-layer 206 is an InP or InGaAs layer, the sealing layer 214 is a dielectric passivation layer such as silicon oxide ($SiO_2$) or silicon nitride (SiN) layer. The P- and N-contact rings 210 and 212, respectively, and P- and N-contact pads 220 and 222, respectively, can be composed of titanium, platinum, or gold, or a stack thereof. Some layers, for instance lattice matching layers, etch stop layers, etc., have been omitted from FIG. 2 for clarity. As a skilled artisan will understand, such layers may be needed, depending on the material composition selected and structure details of the PIN diode 200.

Other types of photodiodes, for example avalanche diodes, can be used with the present invention. Other types of structures, for example planar structures, can also be used. Furthermore, other types of semiconductor devices, for example laser diodes, can be used. For all these devices, oxidizing the exposed street area (for dicing or scribe-and-break process to separate the die) will result in reduced failure rates due to sealing layer delamination.

Figure 3:
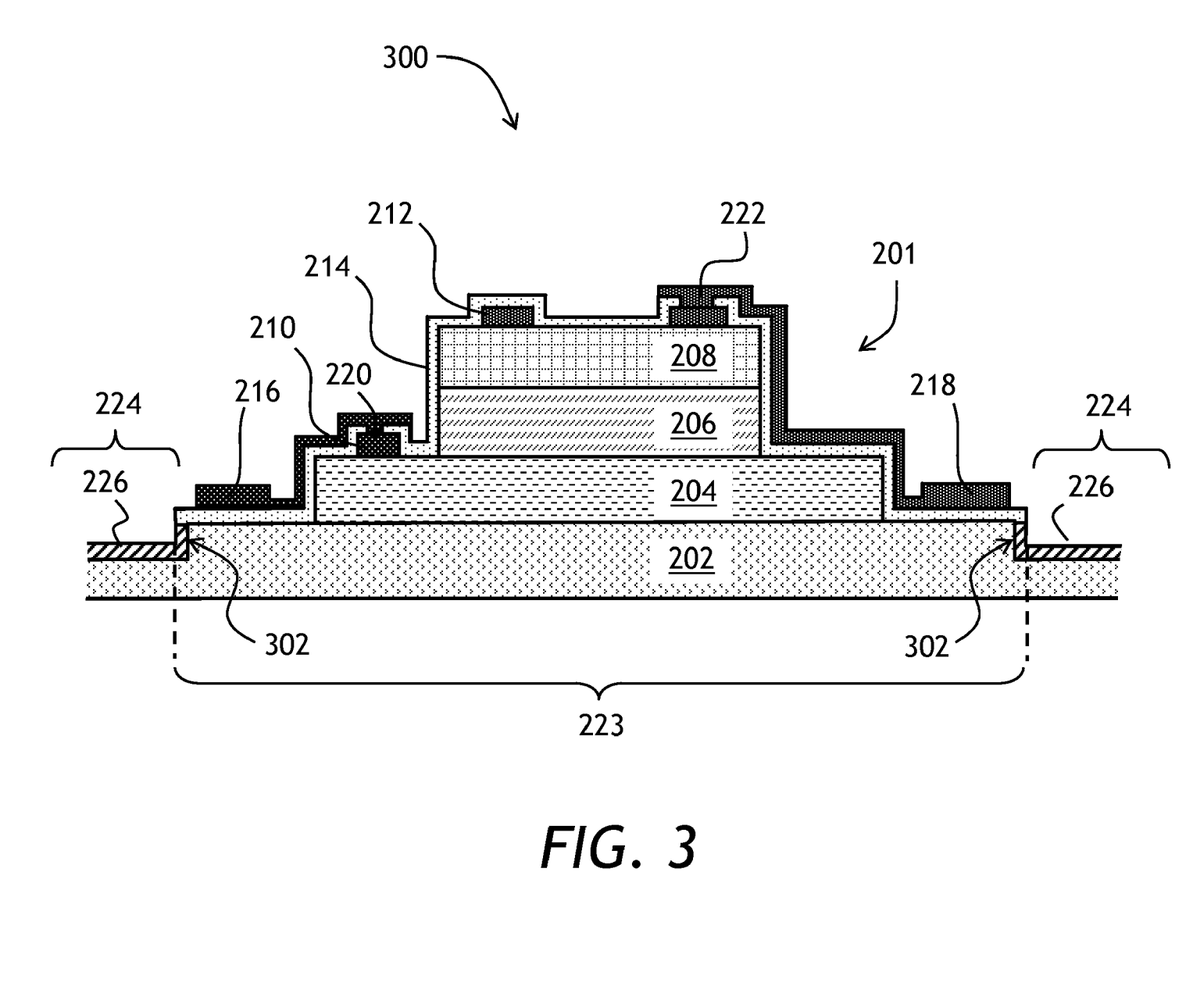
FIG. 3 is a lateral cross-sectional view of a semiconductor device of the present invention having an oxidized substrate surface having a vertical step, with the oxidized semiconductor region extending up the vertical step.
Figure 4:
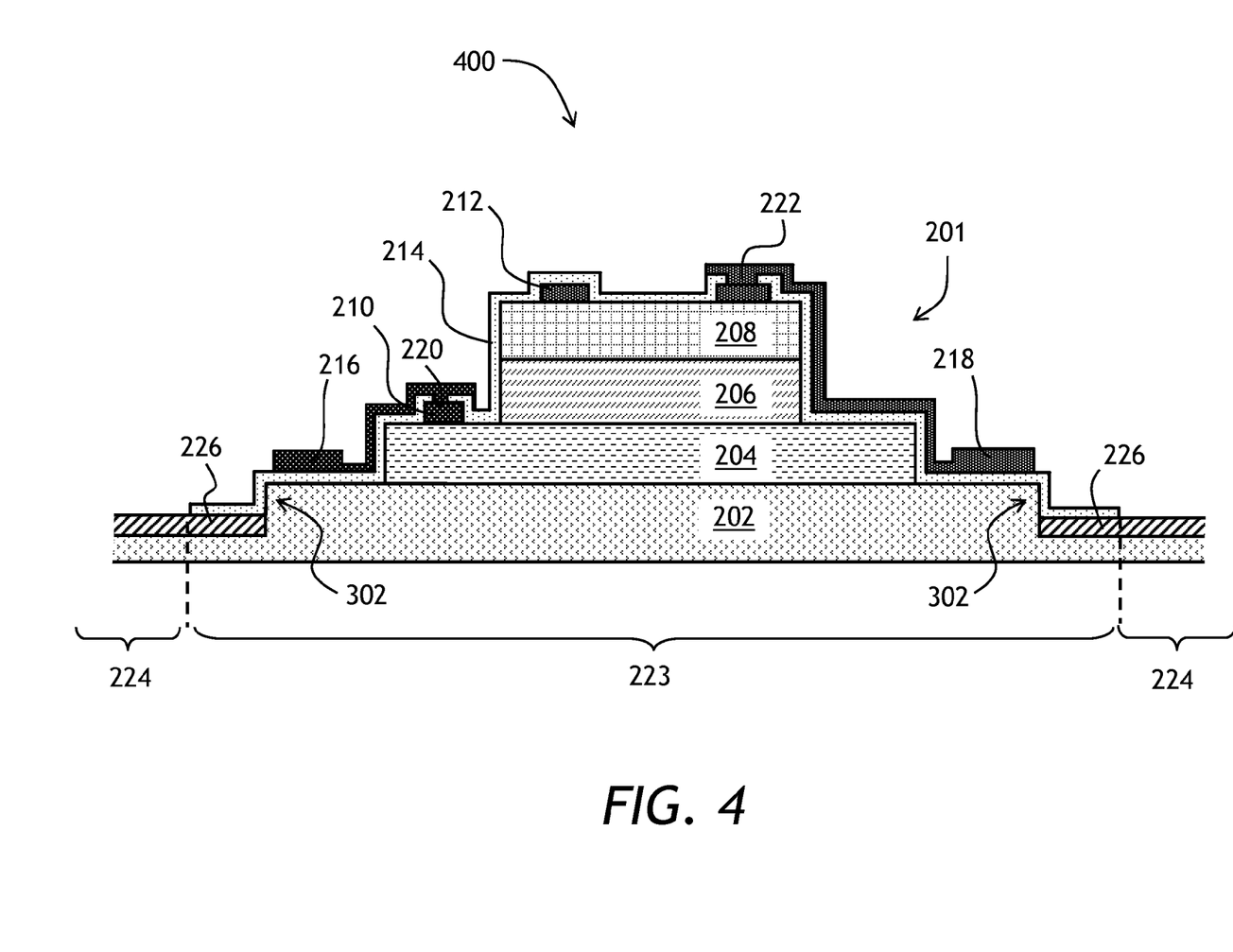
FIG. 4 is a lateral cross-sectional view of a semiconductor device of the present invention having a oxidized substrate surface having a vertical step, with the sealing layer extending up the vertical step.
Figure 5:
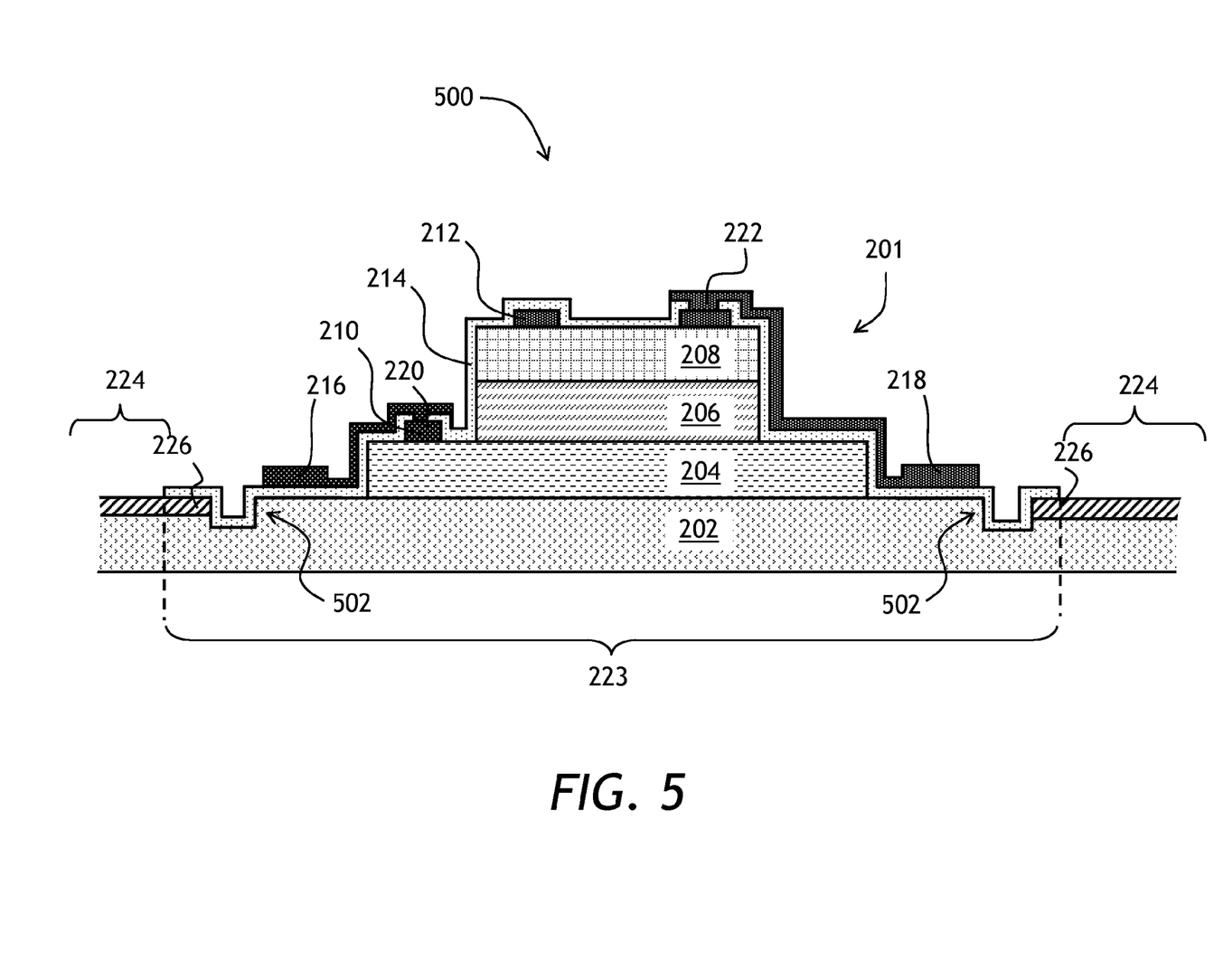
FIG. 5 is a lateral cross-sectional view of a semiconductor device of the present invention having a oxidized substrate surface and a groove around the device, with the sealing layer extending along the walls and the bottom of the groove.

Referring now to FIGS. 3 to 5, three different embodiments of a PIN photodiode structure are shown, wherein the substrate has a step or a groove for improved delamination resistance.

Turning to FIG. 3, a lateral cross-sectional view of a PIN photodiode 300 of the present invention is shown. The PIN photodiode 300 has a similar structure as the PIN photodiode 200 of FIG. 2, with an exception that a vertical step 302 exists between the structure and the street areas 223 and 224, respectively. The oxidized regions 226 extend along a horizontal lower run and up a vertical riser or wall of the vertical step 302, abutting the sealing layer 214.

Referring now to FIG. 4, a lateral cross-sectional view of a PIN photodiode 400 of the present invention is shown. The PIN photodiode 400 has a similar structure as the PIN photodiode 300 of FIG. 3, with an exception that the sealing layer 214, and not the oxidized region 226, extends up the vertical riser and along the lower run of the vertical step 302.

Turning now to FIG. 5, a lateral cross-sectional view of a PIN photodiode 500 of the present invention is shown. The PIN photodiode 500 has a similar structure as the PIN photodiode 200 of FIG. 2, with an exception that a rectangular groove 502 exists between the structure and the street areas 223 and 224, respectively. The sealing layer 214 extends down the sidewalls and across the bottom of the groove 502, and is in contact with the oxidized regions 226, which extends along the street area 224 to the sidewall of the groove 502.

The vertical step 302 and the groove 502 in FIGS. 3 to 5 further reduce delamination by providing a barrier for crack and, or delamination propagation.

Figure 6:
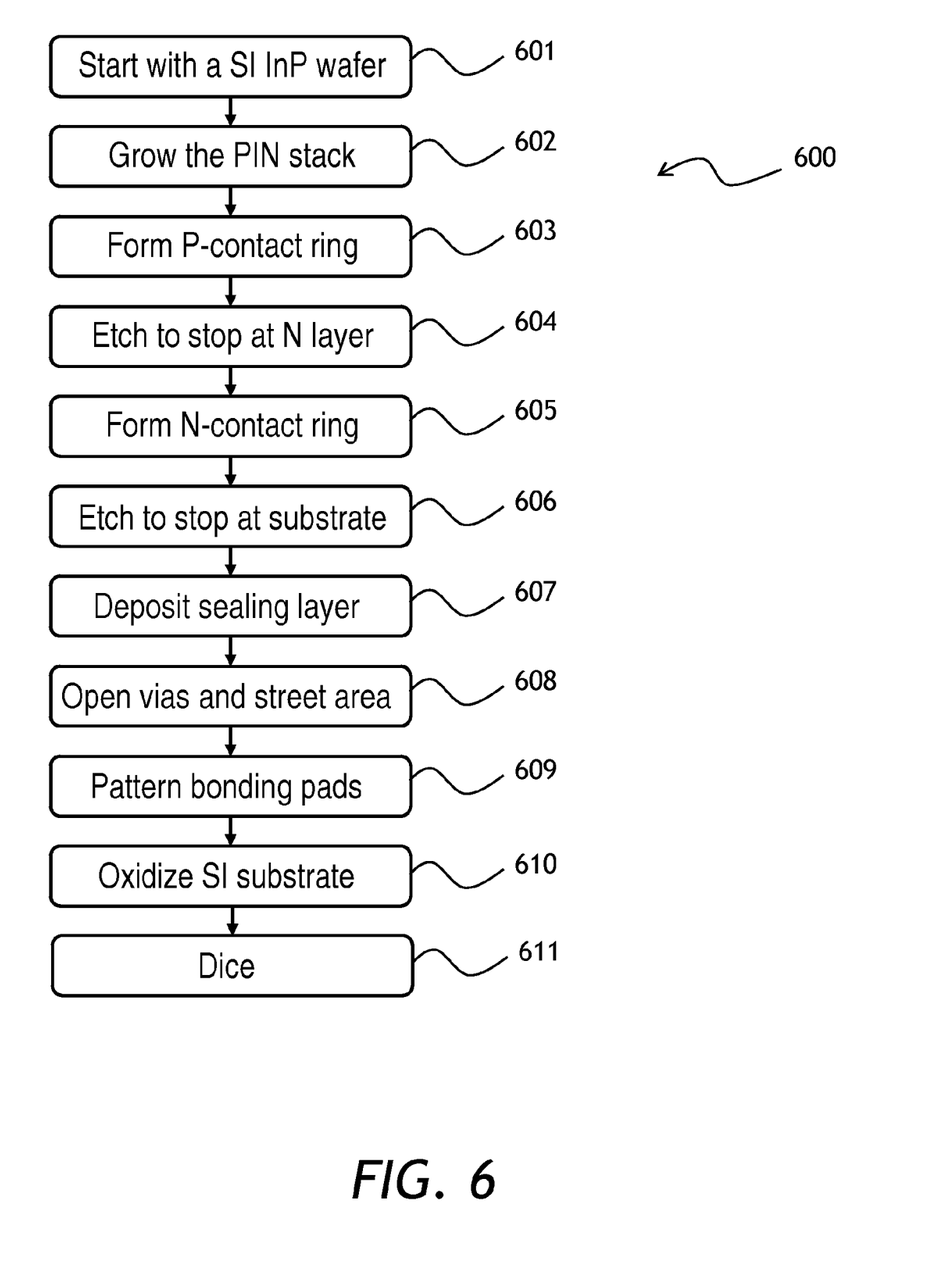
FIG. 6 is a diagram of processing steps for manufacturing sealed semiconductor devices of FIGS. 2.

Referring now to FIG. 6, a process diagram of a process 600 for manufacturing the sealed PIN photodiode 200 of FIG. 2 is shown. At a step 601, the SI InP substrate 202 is provided. At a step 602, the planar PIN stack 201 is grown on the top surface 225 of the SI substrate 202. Step 602 by itself consists of many sub-steps, including growing the N-type InP layer 204, the I-type InGaAs layer 206, and the P-type InP or InGaAs layer 208, as well as intermediate layers such as a lattice matching layer, an etch stop layer, etc. At a step 603, the P-contact metal ring 212 is manufactured by depositing a planar metal layer and patterning the metal layer to form the ring 212 using a lift-off process. At a step 604, the layer stack 204/206/208 is etched to stop at the N-type layer 204. At a step 605, a N-contact metal ring 210 is manufactured by using metal deposition and lift-off processes. At a step 606, the layer stack 204/206/208 is further etched to completely define the mesa structure 201. At a step 607, the passivation/sealing layer 214 is deposited on top of the entire structure, including the mesa structure 201 and the street area 224. At a step 608, the sealing layer 214 is patterned to open the vias 220 and 222, as well as to expose at least a portion of the street area 224 for subsequent processing. At a step 609, the N- and P-bonding pads 216 and 218, respectively, are formed using deposition, patterning, and lift-off processes.

According to the present invention, the exposed street areas of the SI substrate are oxidized at a step 610, so as to obtain the oxidized regions 226. The oxidization is preferably performed using an anodization process. The substrate wafer is inserted into an oxidizing electrolytic solution, and an electric current is passed through the solution using the wafer as a positive electrode, to speed up the oxidization process.

As a result of the oxidization process, the oxidized regions 226 are in contact with the sealing layer 214. The duration of anodizing and/or the anodizing electric current are selected so as to cause the oxidized region 226 to extend beneath the sealing layer 214. In principle, oxidization can be performed before deposition of the sealing layer 214, for as long as the end result of the process is the sealing layer 214 contacting the oxidized region 226. The crystalline nature of the substrate 202 is preserved upon oxidization. Due to the oxidized region 226 being integral with the rest of the substrate 202, no "delamination" of the oxidized region 226 can occur, and micro-cracks, caused by device separation, do not propagate up to the sealing layer 214 upon dicing of the street area 224 at a step 611.

The process 600 can be used to manufacture the photodiodes 300, 400, and 500 of FIGS. 3, 4, and 5. To manufacture the photodiodes 300, 400, or 500, the process 600 contains an additional step, not shown in FIG. 6, of etching the vertical step 302 or the groove 502 in the substrate 202 at the boundary between the street and the structure areas 224 and 223, respectively, for the sealing layer 214 and, or the oxidized region 226 to extend up the vertical step 302, or along walls of the groove 502, as the case may be.

Referring now to FIGS. 7A to 7D, four isometric views of a square section 700 of a semiconductor wafer are shown. In FIGS. 7A to 7D, the semiconductor wafer is processed according to the process 600 of FIG. 6 to manufacture a plurality of PIN photodiodes 200 of FIG. 2.

Figure 7A:
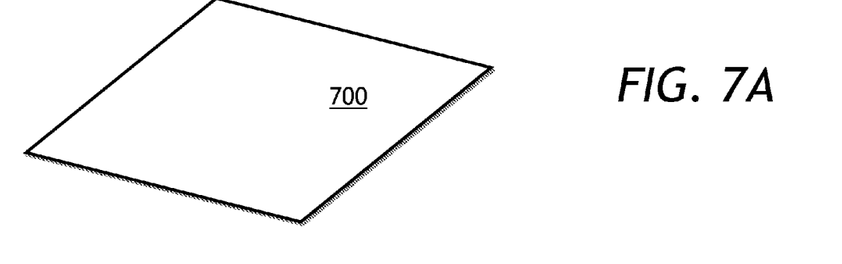
FIGS. 7A to 7D are isometric views of a semiconductor substrate at various processing steps of FIG. 6.

Turning to FIG. 7A, the bare SI InP wafer section 700 is shown. FIG. 7A corresponds to the initial step 601 of the process 600 of FIG. 6.

Figure 7B:
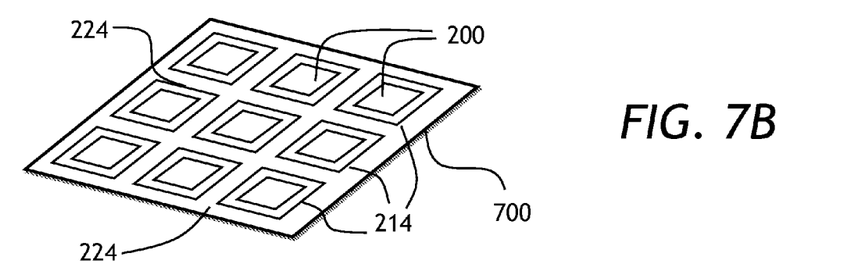

Turning to FIG. 7B, a plurality of PIN photodiodes 200 are formed on the wafer section 700. The sealing layer 214 is patterned to expose the street area 224. FIG. 7B corresponds to the processed wafer at the step 608 of the process 600 of FIG. 6.

Figure 7C:
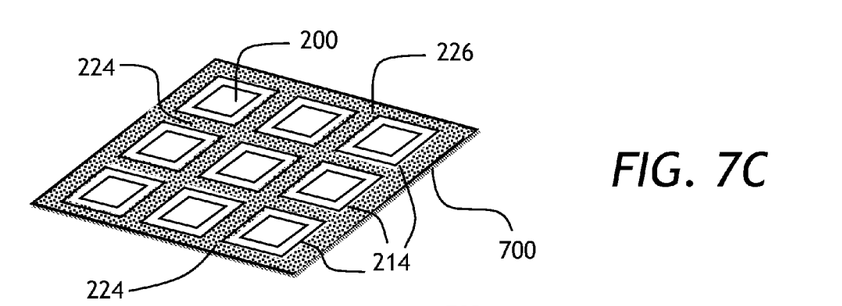

Referring now to FIG. 7C, the street area 224 is oxidized to form the oxidized region 226. Preferably, the oxidized region 226 extends from beneath the sealing layer 214, through the street area 224, and to an edge of the substrate 700. FIG. 7C corresponds to the processed wafer at the step 610 of the process 600 of FIG. 6.

Figure 7D:
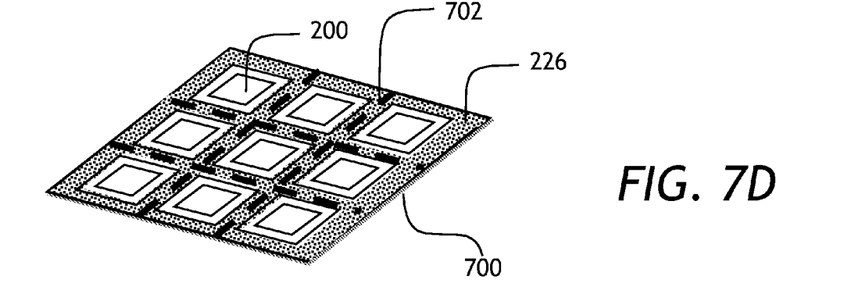

Turning now to FIG. 7D, the wafer is diced into individual photodiode chips 200 along the lines 702 in the oxidized region 226. FIG. 7D corresponds to the final process step 611 (dicing) of the process 600 of FIG. 6.

The foregoing description of various embodiments of the invention has been presented for the purposes of illustration. It is not intended to be exhaustive or to limit the invention to the precise form disclosed. As a skilled artisan will realize, many modifications and variations are possible in light of the above teaching. For example, coating may involve a vacuum deposition, a chemical vapor deposition, or spin coating. The semiconductor structures may involve homostructures or heterostructures. The oxidizing may involve a thermal oxide growth. It is intended that the scope of the invention be limited not by this detailed description, but rather by the claims appended hereto.

What is claimed is:

1. A sealed semiconductor device comprising:
 a single-material substrate having a top surface including adjacently disposed structure and street areas;
 a semiconductor layer structure disposed on the structure area;
 a sealing layer disposed on the semiconductor layer structure, for sealing the semiconductor layer structure;
 wherein the street area includes an exposed oxidized portion of the substrate in contact with the sealing layer, for lessening delamination of the sealing layer from the substrate.

2. The semiconductor device of claim 1, wherein the oxidized portion is at least 0.2 microns thick and contains at least 90% oxide.

3. The semiconductor device of claim 1, wherein the oxidized portion has an uninterrupted crystalline structure of the substrate.

4. The semiconductor device of claim 3, wherein the substrate comprises a semi-insulating (SI) substrate.

5. The semiconductor device of claim 1, wherein the sealing layer comprises a dielectric passivation layer.

6. The semiconductor device of claim 5, wherein the dielectric passivation layer comprises a silicon oxide or silicon nitride layer.

7. The semiconductor device of claim 1, wherein the street area is recessed into the substrate, so that a vertical step exists between the structure and the street areas.

8. The semiconductor device of claim 7, wherein the oxidized portion extends up the vertical step.

9. The semiconductor device of claim 7, wherein the sealing layer extends up the vertical step.

10. The semiconductor device of claim 1, further comprising a groove in the substrate between the structure area and the street area, wherein the sealing layer extends along walls of the groove.

11. The semiconductor device of claim 1, wherein the sealing layer overlaps the oxidized portion.

12. The semiconductor device of claim 1, wherein the oxidized portion extends to an edge of the substrate.

13. The semiconductor device of claim 1, wherein the semiconductor layer structure comprises a mesa structure.

14. The semiconductor device of claim 1, wherein the semiconductor device comprises a PIN photodiode or a laser diode.

15. A method of manufacturing the semiconductor device of claim 1, comprising:
   (a) providing the semiconductor layer structure disposed on the structure area of the top surface of the single-material substrate;
   (b) depositing the sealing layer on top of the semiconductor layer structure;
   (c) patterning the sealing layer to expose the street area of the top surface of the substrate; and
   (d) oxidizing the street area, so as to obtain the oxidized portion, in contact with the sealing layer patterned in step (c).

16. The method of claim 15, further comprising etching a vertical step or a groove in the substrate at the boundary between the street and the structure areas, for the sealing layer and/or the oxidized portion to extend up the vertical step or along walls of the groove.

17. The method of claim 15, wherein in step (d), the oxidizing is performed by anodizing, and a duration of anodizing and/or an anodizing current are selected so as to cause the oxidized portion to extend beneath the sealing layer.

18. A method for lessening delamination of a sealing layer for sealing a semiconductor layer structure disposed on a single-material substrate, the method comprising:
   (a) coating the semiconductor layer structure with a sealing layer;
   (b) patterning the sealing layer to open a street area on the single-material substrate; and
   (c) oxidizing the street area opened in step (b), so as to form in the street area an exposed oxidized portion of the substrate, so that the sealing layer is in contact with the oxidized portion.

19. The method of claim 18, wherein step (c) comprises anodizing the substrate to oxidize the exposed portion of the street area.

20. The method of claim 19, wherein in step (c), a duration of anodizing and/or an anodizing current are selected so as to cause the oxidized portion to extend beneath the sealing layer.

* * * * *